(12) United States Patent
Adjiwibawa et al.

(10) Patent No.: US 11,129,284 B2
(45) Date of Patent: Sep. 21, 2021

(54) DISPLAY SYSTEM AND RIGID FLEX PCB WITH FLIP CHIP BONDED INSIDE CAVITY

(71) Applicant: Apple Inc., Cupertino, CA (US)

(72) Inventors: Adam Adjiwibawa, Cupertino, CA (US); Shaowei Qin, Milpitas, CA (US); Victor H. Yin, Cupertino, CA (US); Wenyong Zhu, Saratoga, CA (US); Steven M. Scardato, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/912,522

(22) Filed: Jun. 25, 2020

(65) Prior Publication Data

US 2021/0084777 A1 Mar. 18, 2021

Related U.S. Application Data

(60) Provisional application No. 62/901,244, filed on Sep. 16, 2019.

(51) Int. Cl.
*H05K 1/00* (2006.01)
*H05K 3/46* (2006.01)
(52) U.S. Cl.
CPC ......... *H05K 3/4691* (2013.01); *H05K 3/4697* (2013.01)

(58) Field of Classification Search
USPC ........................................................ 361/751
See application file for complete search history.

(56) References Cited

U.S. PATENT DOCUMENTS

| | | | |
|---|---|---|---|
| 7,350,326 B2 | 4/2008 | Hu | |
| 9,349,969 B2 * | 5/2016 | Kwon | H01L 51/0097 |
| 9,756,733 B2 | 9/2017 | Drzaic et al. | |
| 9,992,862 B2 | 6/2018 | Shin et al. | |
| 2014/0062607 A1 * | 3/2014 | Nair | H01L 23/5389 |
| | | | 331/68 |

* cited by examiner

*Primary Examiner* — Andargie M Aychillhum
(74) *Attorney, Agent, or Firm* — Aikin & Gallant, LLP

(57) ABSTRACT

A rigid flex printed circuit board (PCB), method of manufacture, and display system incorporating the same are described. In an embodiment, a rigid flex PCB includes a flexible area extending from an adjacent routing area that is thicker than the flexible area. A flexible inner core spans the flexible area and the adjacent routing area. Outer stack-up layers are on the flexible inner core in the adjacent routing area. A cavity is formed in the outer stack-up layers in the routing area and exposes the flexible inner core. In an embodiment, a display system including such a circuit board may include an electronic component mounted on the flexible inner core within the cavity, and a distal end of the flexible area is bonded to a display panel.

20 Claims, 6 Drawing Sheets

DISPLAY SYSTEM AND RIGID FLEX PCB WITH FLIP CHIP BONDED INSIDE CAVITY

RELATED APPLICATIONS

This application claims the benefit of priority from U.S. Provisional Patent Application Ser. No. 62/901,244 filed on Sep. 16, 2019, the full disclosure of which is incorporated herein by reference.

BACKGROUND

Field

Embodiments described herein relate to display systems, and more particularly to rigid flex printed circuit boards.

Background Information

Display panels commonly include a display area and a contact ledge for attachment of a flex circuit to connect electronic components associated with the display panel function including driver integrated circuits (ICs), timing controller (TCON), touch controller, memory, processor, power management circuit, wireless controller, etc. Such electronic components may be located on a rigid printed circuit board (PCB) at an opposite end of the flex circuit.

Two widely adopted manners for packaging display panels based on organic light emitting diode (OLED) or liquid crystal display (LCD) technologies include chip-on-glass (COG) packaging and chip-on-film (COF) packaging. In an exemplary COG module, a display panel includes a contact ledge adjacent to the display screen area where a flex circuit, also referred to as a flexible printed circuit (FPC), is attached to connect one or more electronic components to the display panel. In such a configuration the one or more driver ICs or TCON, for example, may also be mounted on the contact ledge. The remainder of the electronic components for display panel operation can be mounted on the PCB, which can be wrapped behind the display panel with the flex circuit. COF packaging is similar to COG packaging, with one main difference being that the one or more driving ICs and/or TCON are moved from the display panel onto the flex circuit. In such a configuration the contact ledge may require less space than COG packaging.

SUMMARY

A rigid flex printed circuit board (PCB), method of manufacture, and display system incorporating the same are described. In an embodiment, a rigid flex PCB includes a flexible area extending from an adjacent routing area that is thicker than the flexible area. A flexible inner core spans the flexible area and the adjacent routing area. Outer stack-up layers are located on the flexible inner core in the adjacent routing area and contributed to the increased thickness. A cavity is formed in the outer stack-up layers in the routing area and exposes the flexible inner core.

In an embodiment, a method of fabricating a rigid flex PCB includes forming the flexible inner core that includes a flexible metal routing layer. Outer stack-up layers are then formed on only a portion of the flexible inner core to form an adjacent routing area, such that a flexible area of the flexible inner core extends away from the adjacent routing area. A cavity can then be formed in the adjacent routing area that exposes the flexible inner core. Alternatively, the cavity can be formed during formation of the outer stack-up layers.

In accordance with embodiments, a flexible metal routing layer can be used to connect an electronic component to a display panel. In an embodiment, a display system includes a circuit board including a flexible area extending from an adjacent routing area that is thicker than the flexible area. A flexible inner core spans the flexible area and the adjacent routing area. Outer stack-up layers are on the flexible inner core in the adjacent routing area. A distal end of the flexible area is bonded to a display panel, and a cavity is located in the outer stack-up layers in the routing area that exposes the flexible inner core. The electronic component, such as a TCON chip, is mounted on the flexible inner core within the cavity. Specifically, the electronic component can be mounted on the flexible routing layer of the flexible inner core which is also bonded to the display panel. This allows for pitch-matching of landing pads used for connecting the electronic component and the display panel.

DETAILED DESCRIPTION

Figure 1:
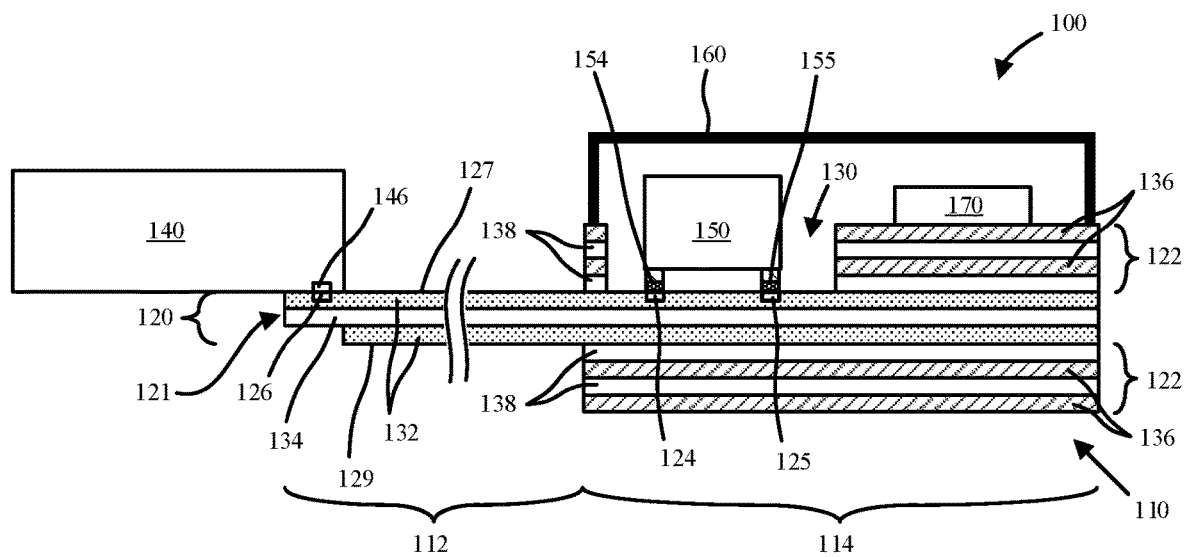
FIG. 1 is a schematic cross-sectional side view illustration of display system including a rigid flex printed circuit board in accordance with an embodiment.

Embodiments describe display systems and rigid flex printed circuit boards (PCBs). In an embodiment, a display system includes a circuit board which includes a flexible area and an adjacent routing area. The flexible area extends from the adjacent routing area and is thicker than the flexible area, and may optionally be rigid. A flexible inner core spans the flexible area and the adjacent routing area. Outer stack-up layers are on the flexible inner core in the adjacent routing area. A distal end of the flexible area is bonded to a display panel, for example, on the contact ledge. A cavity exists in the outer stack-up layers in the routing area and exposes the flexible inner core. In accordance with embodiments, an electronic component is mounted on the flexible inner core within the cavity. In an embodiment, the electronic component is a TCON.

In one aspect, the electronic component can be bonded securely in the (rigid) routing area where there is no bending region. Such a configuration can provide mechanical integrity not available when bonded to a flex circuit, such as with COF. Furthermore, a shielding can be formed over the (rigid) routing area, providing additional electrical protection of the electronic component (e.g. from electrical interference) not available with COF.

In another aspect, bonding of the electronic component directly onto the flexible inner core allows for direct bonding onto smaller pitch routing than is available on traditional PCBs for display assembly. Factors that may contribute to minimum pitch size include ball grid array (BGA) solder bump size, via size, and physical and electrical requirements of the metal wiring layers. In accordance with embodiments, the flexible metal routing layers of the flexible inner core can be fabricated using a subtractive approach in which metal layers can be grown using a plating technique, and then etched to form the flexible metal routing layers. Such a technique can provide additional mechanical integrity for the flexibility requirement since the grown metal layers can be of superior quality (less internal stress, and less prone to cracking) than deposited or grown metal wiring patterns. The ability to produce finer pitch trace routing can allow for pitch-matching landing pads for the electronic component (e.g. TCON) to that of the display panel. Such pitch-matching can aid in sending quality video signals to display panels that require a high number of inputs to a limited area. For example, this may correspond to the number of columns, and pitch, of pixels in a display screen. In this manner, the fine pitch trace routing from the TCON can be pitch-matched with the contact pads on a display panel without having to be fanned out on the rigid flex PCB. In such an implementation a 1:1 ratio is maintained for landing pad pitch of the electronic component (e.g. TCON) and the display panel, though this is not strictly required in accordance with embodiments, and other ratios can be implemented.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer between layers may be directly in contact with the layers or may have one or more intervening layers.

Figure 2:
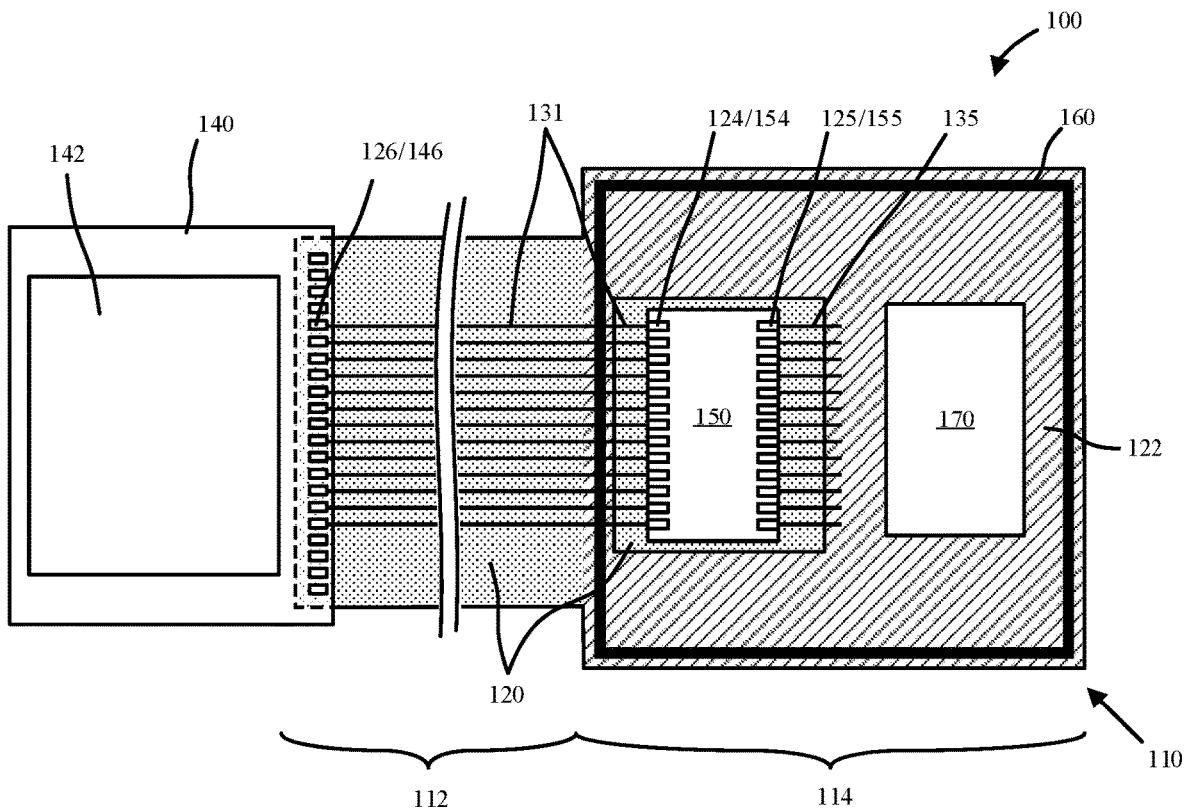
FIG. 2 is a schematic top view illustration of display system including a rigid flex printed circuit board in accordance with an embodiment.
Figure 3:
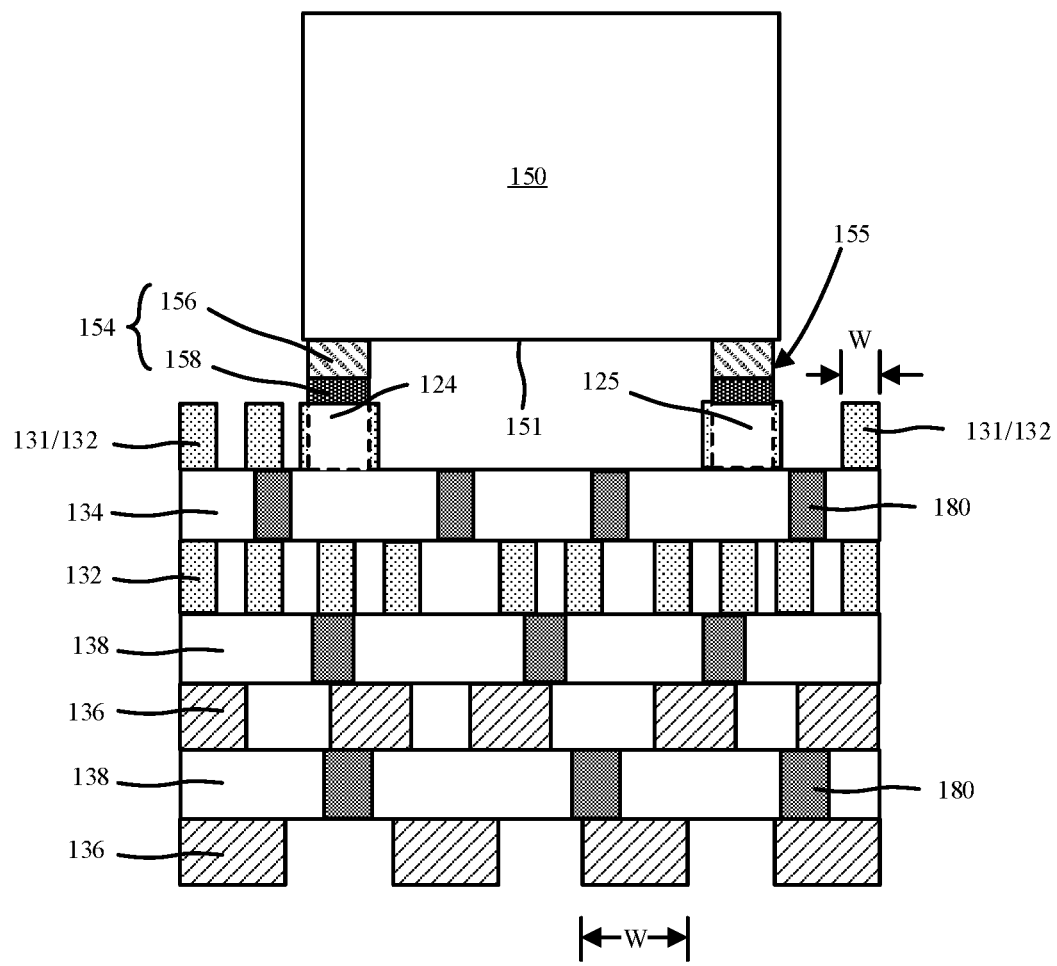
FIG. 3 is a close-up schematic cross-sectional side view illustration of an electronic component bonded to a rigid flex printed circuit board in accordance with an embodiment.

Referring now to FIGS. 1-2 schematic cross-sectional and top view illustrations are provided of a display system including a rigid flex PCB in accordance with an embodiment. FIG. 3 is a close-up schematic cross-sectional side view illustration of an electronic component bonded to a rigid flex PCB in accordance with an embodiment. In interest of clarity and conciseness, the following discussion is made with reference to common features shared in each of FIGS. 1-3.

As shown, in an embodiment a display system 100 includes a rigid flex PCB 110 that has a flexible area 112 extending from an adjacent routing area 114 that is thicker than the flexible area 112. For example, the adjacent routing area 114 may be a rigid area of a rigid flex PCB. A flexible core 120 spans both the flexible area 112 and the adjacent routing area, and outer stack-up layers 122 are formed on the flexible inner core 120 in the adjacent routing area 114. In the embodiment illustrated, the outer stack-up layers 122 are not formed on the flexible inner core 120 in the flexible area 112. Thus, the outer stack-up layers 122 may contribute to the rigidity of the adjacent routing area 114 (e.g. rigid area). In an embodiment, a distal end 121 of the flexible area 112 (e.g. of the flexible inner core 120) is bonded to a display panel 140, which includes a display screen 142. A cavity 130 can be formed in the outer stack-up layers 122 to expose the flexible inner core 120, and an electronic component 150 (e.g. TCON) can be mounted on the flexible inner core within the cavity 130.

In accordance with embodiments, the outer stack-up layers 122 can be formed on either or both the top side 127 and bottom side 129 of the flexible inner core 120. In the particular embodiment illustrated, both the display panel 140 is attached to the top side 127 of the flexible inner core 120, and the cavity 130 is formed in the outer stack-up layers 122 on the top side 127 of the flexible inner core 120. Other arrangements are also possible. Furthermore, additional components 170 (e.g. touch controller, memory, processor, power management circuit, wireless controller, etc.) can be surface mounted onto the top side or bottom side of the outer stack-up layers 122. In an embodiment, a metal shield 160 is mounted on a top side of the outer stack-up layers, and covers the electronic component 150, and optionally one or more additional components 170 mounted on the top side of the stack-up layers 122.

In an embodiment, the flexible inner core 120 includes a first group of landing pads 124 to which the electronic component 150 is bonded, a second group of landing pads 126 to which the display panel 140 is bonded, and a group of trace routings 131 connecting first group of landing pads 124 to the second group of landing pads 126. For example, the first group of landing pads 124 may be output pads to provide video signals to the display panel 140. As shown in FIG. 2, the first group of landing pads 124 can be separated by a same pitch as the second group of landing pads 126. Likewise, the electronic component 150 can include a first group of contacts 154 bonded to the first group of landing pads 124, with the first group of contacts 154 separated by a same pitch as the first group of landing pads 124. Further, the display panel 140 can include a group of contact pads 146 bonded to the second group of landing pads 126, with the group of contact pads 146 separated by a same pitch as the second group of landing pads 126. Input pads to the electronic component 150 can also be pitch matched. In an embodiment, the electronic component 150 includes a second group of contact 155 bonded to, and pitch-matched with, a third group of landing pads 125 of the flexible inner core 120 (e.g. coupled to trace routings 135 to one or more components 170). The first group of contacts 154 may have the same pitch as the second group of contacts 155.

Referring now to the close-up illustration in FIG. 3, each contact of the first and second groups of contacts 154, 155 can include a copper pillar 156 extending from the bottom surface 151 of the electronic component 150. Furthermore, each contact 154, 155 may optionally include a solder tip 158 on the copper pillar 156 for bonding to landing pads 124, 125. In accordance with embodiments, bonding of the electronic component directly onto the flexible inner core allows for direct bonding onto smaller pitch routing than is available on traditional PCBs for display assembly. For example, a traditional PCB may include vias (or micro-vias) characterized by a minimum width of 270 µm. Thus, an electronic component 150 (e.g. TCON) mounted onto a traditional PCB would have a similar pitch, and width of contacts. It has been observed, however, that such pitch and width could require significant fanout when contact pads 146 on a display panel have a much finer pitch. Such fanout can result in reduced display performance. The landing pads 124, 125 in accordance with embodiments may have a significantly reduced pitch and width, such as less than 100 µm, or 70 µm in a specific embodiment. In order to facilitate the finer widths and pitch, the electronic components 150 may be bonded using thermal compression bonding (TCB) directly onto the landing pads 124, 125 of the inner core 120. This avoids use of larger size conventional solder bumps or micro-bumps. TCB may be facilitated by the inclusion of copper pillars 156, with optional solder tips 158.

As shown, in an embodiment, the flexible inner core 120 can include one or more flexible metal routing layers 132 that includes the trace routings 131, and one or more polymer insulating layers 134. The adjacent routing area 114 can include the flexible inner core 120, and one or more metal routing layers 136, and one or more insulating layers 138. For example, insulating layer(s) 138 can be formed of prepreg, including a fiber weave impregnated with a resin bonding agent. The metal routing layer 136 can include routing line widths (W) that are coarser than the line widths (W) of the trace routings 131 (and also have larger pitch). In an exemplary embodiment, the metal routing layer 136 is an outermost metal routing layer, and a via 180 is connected to the outermost metal routing layer, with the via 180 being wider than the line widths (W) of the trace routings 131. Via 180 may also be wider than the pitch of the trace routings 131 as well. Traditional PCB fabrication techniques can be utilized in the fabrication of the outer stack-up layers 122.

Figure 4:
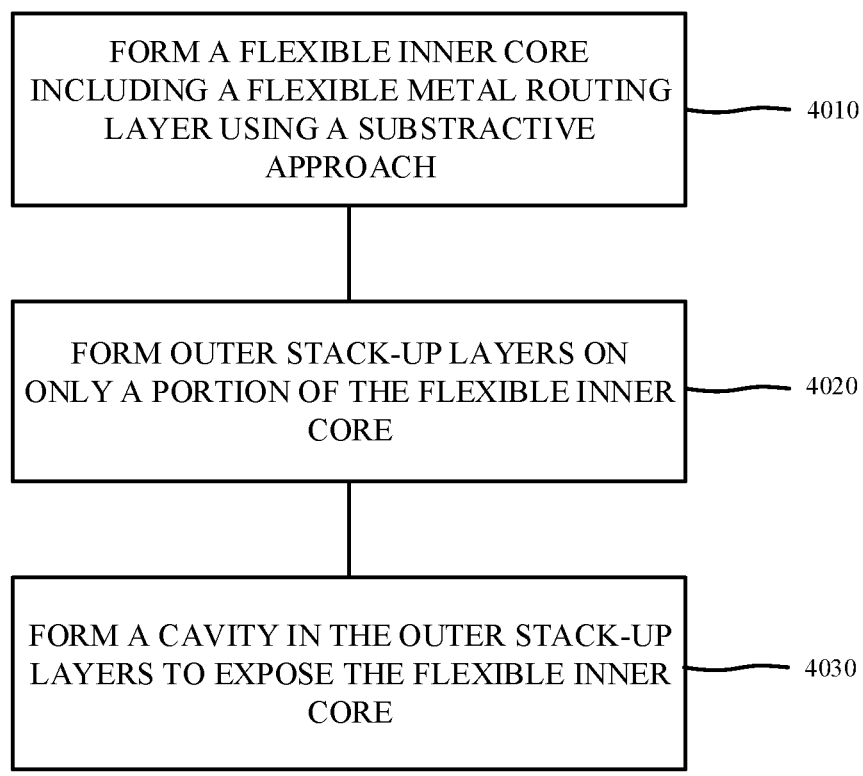
FIG. 4 is a flow chart illustrating a method of forming a rigid flex printed circuit board in accordance with an embodiment.

FIG. 4 is a flow chart illustrating a method of forming a rigid flex PCB 110 in accordance with an embodiment. At operation 4010 a flexible inner core 120 is formed. The flexible inner core may include one more flexible metal routing layer(s) 132 and polymer insulating layer(s) 134. For example, the polymer insulating layer may be a single polymer layer, such as polyimide. At operation 4020 outer stack-up layers 122 are formed on only a portion of the flexible inner core 120 to form an adjacent routing area 114 (which may be rigid), such that a flexible area 112 of the flexible inner core 120 extends away from the adjacent routing area 114. At operation 4030, a cavity 130 is formed in the stack-up layers 122 of the adjacent routing area 114 to expose the flexible inner core 120.

In accordance with an embodiment, forming the one or more flexible metal routing layers 132 includes using a subtractive approach. In a specific example, the polymer insulating layer(s) 134 may be formed using lamination, or other suitable technique. The flexible metal routing layer(s) 132 may then be formed using a technique such as plating (electroless plating or electroplating) of a bulk layer across a polymer insulating layer 134, followed by etching to form wiring such as trace routing 131. In such a subtractive approach the plated metal layer is not patterned until after deposition. This can allow for the reduction of internal stress, and cracking in the final product. Once the flexible inner core 120 is fabricated, the stack-up layers 122 are formed. The insulating layer(s) 138 can be formed of a suitable PCB material such as prepreg. For example, these may be assembled by lamination or another suitable technique. The metal routing layer(s) 136 can be formed using subtractive, additive, or semi-additive techniques, though semi-additive techniques are most commonly employed in traditional PCB manufacture. In an additive or semi-additive technique a patterning film (e.g. dry resist) can be first applied and imaged to form a pattern, followed by deposition or plating of a conductive pattern. This can include both the vias 180 and routing patterns in metal wiring layers 136. A final etching operation may then be performed for fine patterning. In an embodiment, the metal routing layer(s) 136 may include routing line widths (W) that are coarser than the line widths (W) of the flexible metal routing layer 132, and specifically the trace routing 131. Pitch of the corresponding trace lines within the metal routing layer(s) 136 may also be lager than for the flexible metal routing layer 132, and specifically the trace routing 131.

The display systems 100 and rigid flex PCBs 110 in accordance with embodiments can be integrated into electronic devices such as desktop computer, computers built into computer monitors, television set top boxes, audio-video equipment and portable electronic devices such as mobile telephones, tablet computing devices, laptop computers, media players, gaming devices, handheld devices, miniature electronic devices, and wearable devices such as a wristwatch device, or other electronic equipment.

Figure 5:
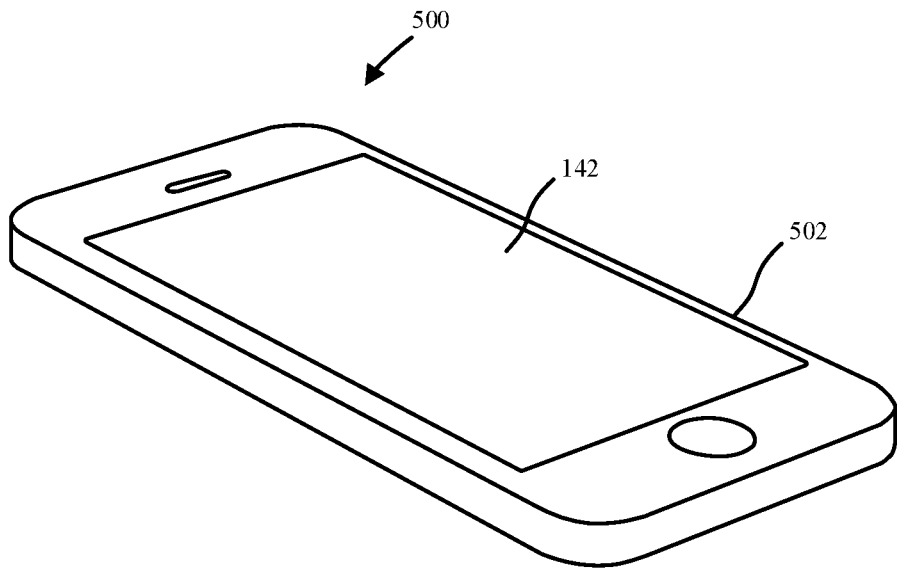
FIG. 5 is an isometric view of a mobile telephone in accordance with an embodiment.
Figure 6:
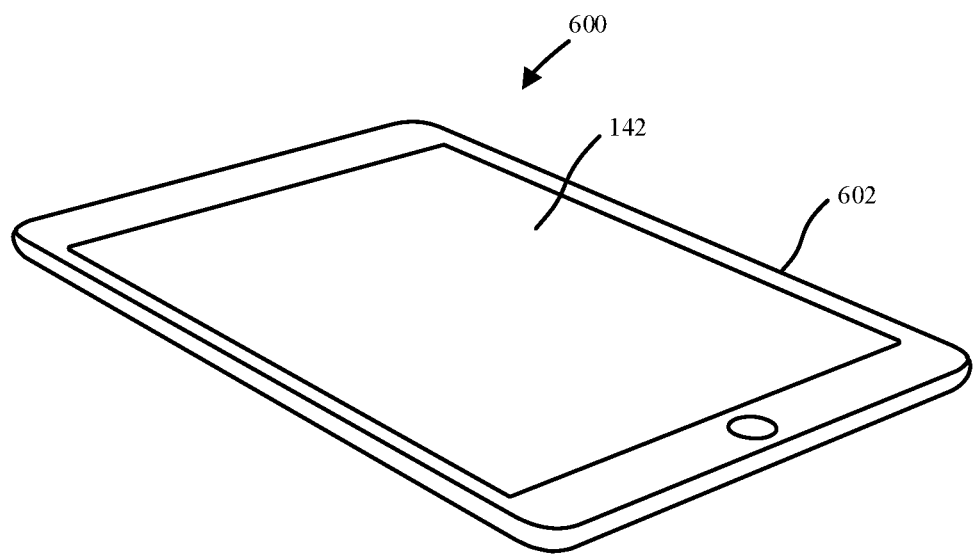
FIG. 6 is an isometric view of a tablet computing device in accordance with an embodiment.
Figure 7:
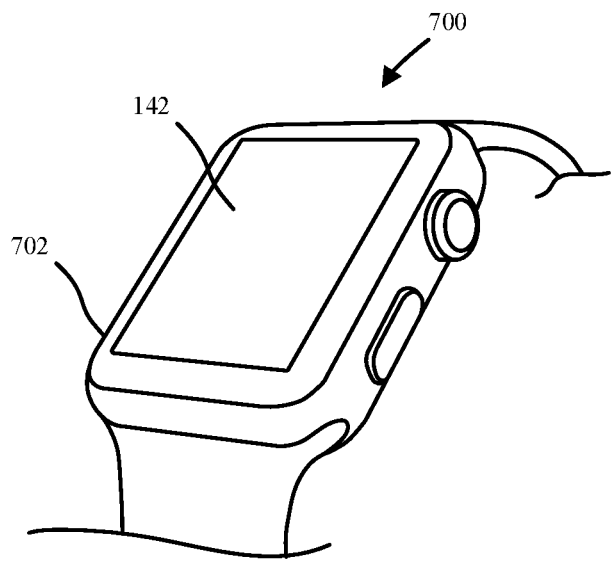
FIG. 7 is an isometric view of a wearable device in accordance with an embodiment.
Figure 8:
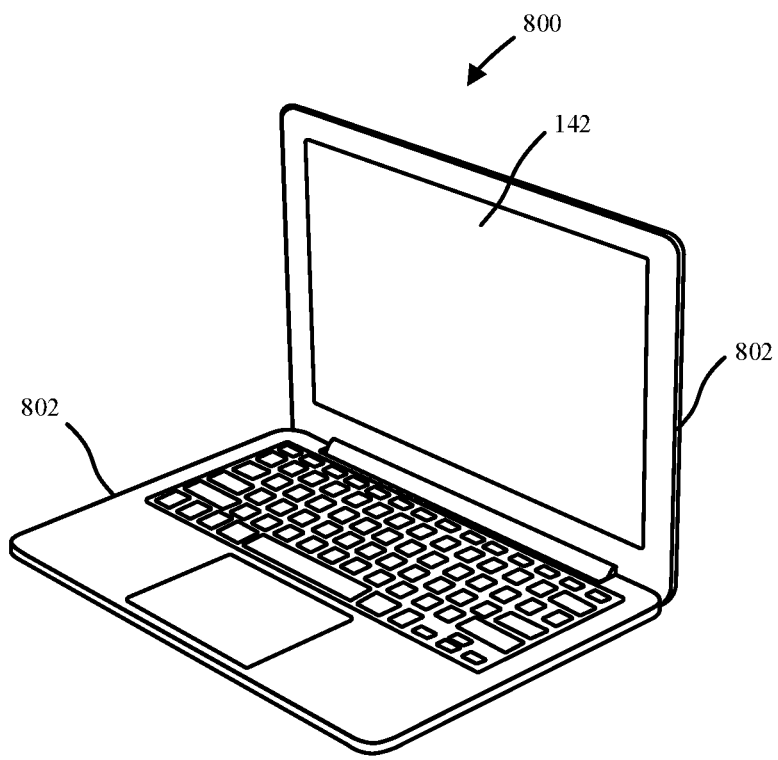
FIG. 8 is an isometric view of a laptop computer in accordance with an embodiment.

FIGS. 5-8 illustrate various portable electronic systems in which the various embodiments can be implemented. FIG. 5 illustrates an exemplary mobile telephone 500 that includes a display system 100 including a display screen 142 packaged in a housing 502. FIG. 6 illustrates an exemplary tablet computing device 600 that includes a display system 100 including a display screen 142 packaged in a housing 602. FIG. 7 illustrates an exemplary wearable device 700 that includes a display system 100 including a display screen 142 packaged in a housing 702. FIG. 8 illustrates an exemplary laptop computer 800 that includes a display system 100 including a display screen 142 packaged in a housing 802.

Figure 9:
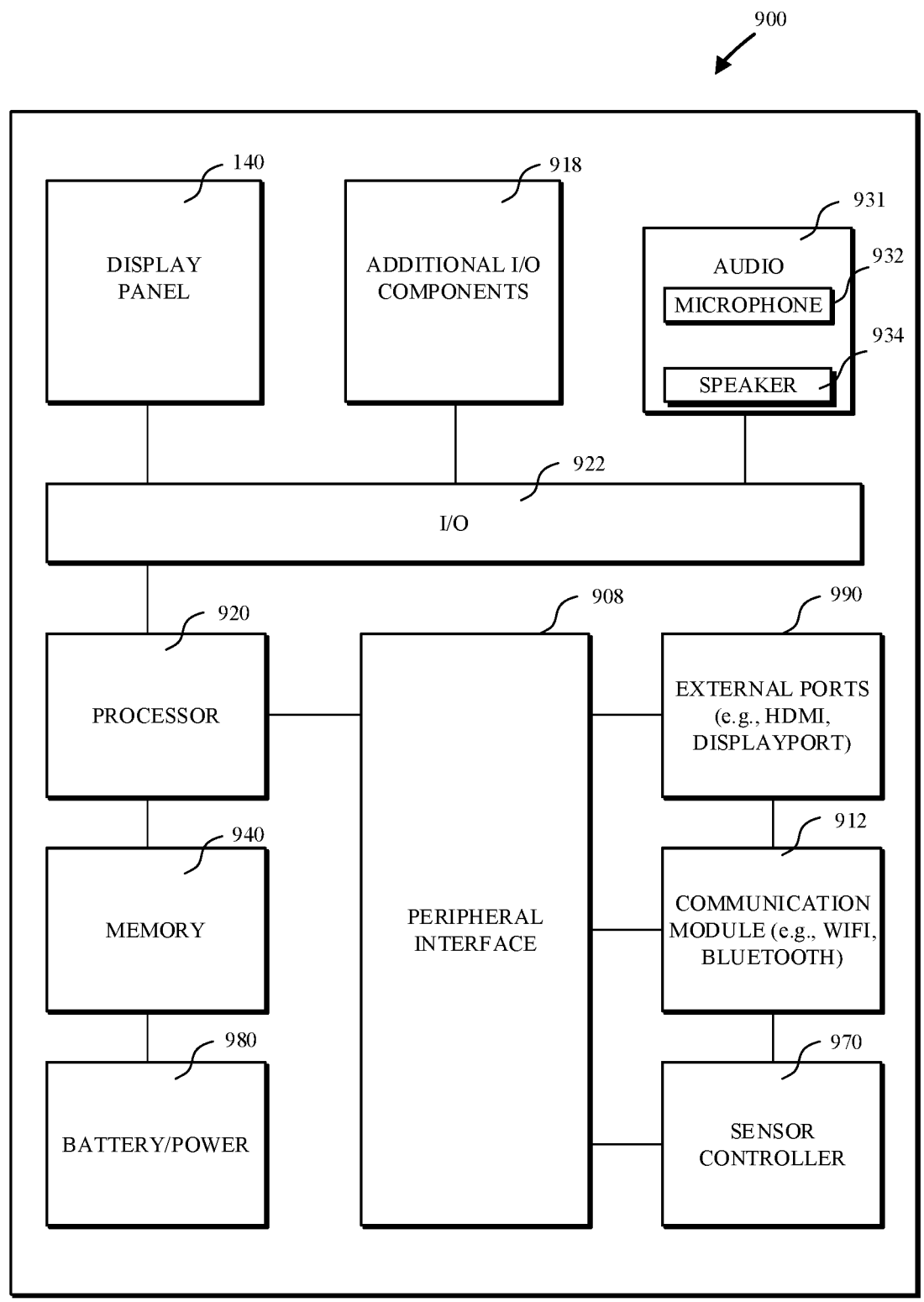
FIG. 9 is a system diagram of a portable electronic device in accordance with an embodiment.

FIG. 9 illustrates a system diagram for an embodiment of a portable electronic device 900 including a display panel 140 described herein. The portable electronic device 900 includes a processor 920 and memory 940 for managing the system and executing instructions. The memory includes non-volatile memory, such as flash memory, and can additionally include volatile memory, such as static or dynamic random access memory (RAM). The memory 940 can additionally include a portion dedicated to read only memory (ROM) to store firmware and configuration utilities.

The system also includes a power module 980 (e.g., flexible batteries, wired or wireless charging circuits, etc.), a peripheral interface 908, and one or more external ports 990 (e.g., Universal Serial Bus (USB), HDMI, Display Port, and/or others). In one embodiment, the portable electronic device 900 includes a communication module 912 configured to interface with the one or more external ports 990. For example, the communication module 912 can include one or more transceivers functioning in accordance with IEEE standards, 3GPP standards, or other communication standards, and configured to receive and transmit data via the one or more external ports 990. The communication module 912 can additionally include one or more WWAN transceivers configured to communicate with a wide area network including one or more cellular towers, or base stations to communicatively connect the portable electronic device 900 to additional devices or components. Further, the communication module 912 can include one or more WLAN and/or WPAN transceivers configured to connect the portable electronic device 900 to local area networks and/or personal area networks, such as a Bluetooth network.

The system can further include a sensor controller 970 to manage input from one or more sensors such as, for example, proximity sensors, ambient light sensors, or infrared transceivers. In one embodiment the system includes an audio module 931 including one or more speakers 934 for audio output and one or more microphones 932 for receiving audio. In embodiments, the speaker 934 and the microphone 932 can be piezoelectric components. The portable electronic device 900 further includes an input/output (I/O) controller 922, a display screen 142, and additional I/O components 918 (e.g., keys, buttons, lights, LEDs, cursor control devices, haptic devices, and others). The display screen 142 and the additional I/O components 918 may be considered to form portions of a user interface (e.g., portions of the portable electronic device 900 associated with presenting information to the user and/or receiving inputs from the user).

In utilizing the various aspects of the embodiments, it would become apparent to one skilled in the art that combinations or variations of the above embodiments are possible for forming a rigid flex PCB and display system incorporating the same. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display system comprising: A rigid flex circuit board including a flexible area extending from an adjacent routing area that is thicker than the flexible area, a flexible inner core spanning the flexible area and the adjacent routing area, and outer stack-up layers on the flexible inner core in the adjacent routing area; wherein a distal end of the flexible area is bonded to a display panel; a cavity in the outer stack-up layers in the routing area that exposes the flexible inner core; and an electronic component mounted on the flexible inner core within the cavity.

2. The display system of claim 1, wherein the flexible inner core comprises:
a first group of landing pads to which the electronic component is bonded;
a second group of landing pads to which the display panel is bonded; and
a group of trace routings connecting the first group of landing pads to the second group of landing pads.

3. The display system of claim 2, wherein the first group of landing pads is separated by a same pitch as the second group of landing pads.

4. The display system of claim 3, wherein the electronic component comprises a first group of contacts bonded to the first group of landing pads, wherein the first group of contacts is separated by a same pitch as the first group of landing pads.

5. The display system of claim 4, wherein the electronic component comprises a second group of contacts bonded to a third group of landing pads of the flexible inner core.

6. The display system of claim 5, wherein the first group of contacts has a same pitch as the second group of contacts.

7. The display system of claim 5, wherein each contact of the first group of contacts and the second group of contacts comprises a copper pillar extending from a bottom surface of the electronic component.

8. The display system of claim 4, wherein the electronic component comprises a timing controller.

9. The display system of claim 4, further comprising a metal shield mounted on the adjacent routing area and covering the electronic component.

10. The display system of claim 4, wherein the adjacent routing area is rigid.

11. The display system of claim 4:
wherein the flexible inner core comprises:
a flexible metal routing layer that includes the trace routings; and
a polymer insulating layer;
wherein the adjacent routing area comprises:
the flexible inner core;
a metal routing layer; and
an insulating layer.

12. The display system of claim 11, wherein the metal routing layer includes routing line widths that are coarser than line widths of the trace routings.

13. The display system of claim 12, wherein the metal routing layer is an outermost metal routing layer, and further comprising a via connected to the outermost metal routing layer, wherein the via is wider than the line widths of the trace routings.

14. A rigid flex printed circuit board comprising:
a flexible area extending from an adjacent routing area that is thicker than the flexible area, a flexible inner core spanning the flexible area and the adjacent routing area, and outer stack-up layers on the flexible inner core in the adjacent routing area; and
a cavity in the outer stack-up layers in the routing area that exposes the flexible inner core.

15. The rigid flex printed circuit board of claim 14:
wherein the flexible inner core comprises:
a flexible metal routing layer; and
a polymer insulating layer;
wherein the adjacent routing area comprises:
the flexible inner core;
a metal routing layer; and
an insulating layer.

16. The rigid flex printed circuit board of claim 15, wherein the metal routing layer includes routing line widths that are coarser than line widths of the flexible metal routing layer.

17. The rigid flex printed circuit board of claim 16, wherein the metal routing layer is an outermost metal routing layer, and further comprising a via connected to the outermost metal routing layer, wherein the via is wider than the line widths of the flexible metal routing layer.

18. A method of fabricating a rigid flex printed circuit board comprising:
forming a flexible inner core including a flexible metal routing layer;
forming outer stack-up layers on only a portion of the flexible inner core to form an adjacent routing area, such that a flexible area of the flexible inner core extends away from the adjacent routing area; and
forming a cavity in the adjacent routing area that exposes the flexible inner core.

19. The method of claim 18, wherein forming the flexible inner core comprises forming the flexible metal routing layer using a subtractive approach.

20. The method of claim 19, wherein the outer stack-up layers include a metal routing layer with routing line widths that are coarser than line widths of the flexible metal routing layer.

* * * * *